(12) United States Patent
Chin et al.

(10) Patent No.: US 8,874,980 B2
(45) Date of Patent: Oct. 28, 2014

(54) CHIP APPLIED TO SERIAL TRANSMISSION SYSTEM AND ASSOCIATED FAIL SAFE METHOD

(71) Applicant: Silicon Touch Technology Inc., Hsin-Chu (TW)

(72) Inventors: Chi-Yuan Chin, Taipei (TW); Kuei-Jyun Chen, Taoyuan County (TW)

(73) Assignee: Silicon Touch Technology Inc., Science-Based Industrial Park, Hsin-Chu (TW)

( * ) Notice: Subject to any disclaimer, the term of this patent is extended or adjusted under 35 U.S.C. 154(b) by 47 days.

(21) Appl. No.: 13/735,019

(22) Filed: Jan. 6, 2013

(65) Prior Publication Data
US 2013/0346821 A1    Dec. 26, 2013

(30) Foreign Application Priority Data
Jun. 26, 2012    (TW) .............................. 101122782 A

(51) Int. Cl.
*G01R 31/28* (2006.01)
*H04L 1/18* (2006.01)
*H04L 12/947* (2013.01)
*H04L 12/939* (2013.01)
*G01R 31/3185* (2006.01)
*H04L 12/933* (2013.01)

(52) U.S. Cl.
CPC ...... *H04L 1/1809* (2013.01); *G01R 31/318505* (2013.01); *H04L 49/15* (2013.01); *G01R 31/318541* (2013.01); *H04L 49/25* (2013.01); *H04L 49/109* (2013.01); *H04L 49/552* (2013.01)

USPC ........... 714/712; 714/748; 714/726; 714/727; 714/729; 714/821

(58) Field of Classification Search
CPC ............... G01R 31/318541; G01R 31/318505; H04L 49/25; H04L 49/15
USPC .................. 714/748, 712, 726, 727, 729, 821
See application file for complete search history.

(56) References Cited

U.S. PATENT DOCUMENTS 4,872,169 A * 10/1989 Whetsel, Jr. ................... 714/727
5,132,962 A     7/1992 Hobgood et al.

(Continued)

FOREIGN PATENT DOCUMENTS

DE    10 2007 044 820         *  4/2009    ............ H04L 12/403
DE    10 2007 044 820 A1    4/2009

(Continued)

*Primary Examiner* — John Trimmings
(74) *Attorney, Agent, or Firm* — Winston Hsu; Scott Margo

(57) ABSTRACT

A chip applied to a serial transmission system includes an input terminal, a core circuit, an output terminal, a first transmission line, a second transmission line and a spare transmission line, where the input terminal is used to receive an input signal from a source outside the chip, the output terminal is used to output an output signal, the first transmission lines is coupled between the input terminal and the core circuit, the second transmission line is coupled between the core circuit and the output terminal, and the spare transmission line is coupled between the input terminal and the output terminal. When the core circuit cannot process the input terminal normally, the input signal is directly transmitted to the output terminal via the spare transmission line, and the input signal serves as the output signal to be outputted from the output terminal.

17 Claims, 6 Drawing Sheets

(56) References Cited

U.S. PATENT DOCUMENTS

| | | | | |
|---|---|---|---|---|
| 5,477,545 | A | * | 12/1995 | Huang ............ 714/727 |
| 6,448,671 | B1 | | 9/2002 | Wallace |
| 7,694,199 | B2 | * | 4/2010 | Whetsel ............ 714/726 |
| 2003/0163773 | A1 | * | 8/2003 | O'Brien et al. ............ 714/726 |
| 2005/0097255 | A1 | | 5/2005 | Barenys |
| 2009/0121776 | A1 | | 5/2009 | Nagase |

FOREIGN PATENT DOCUMENTS

| | | | | |
|---|---|---|---|---|
| JP | S6120350 | A | | 1/1986 |
| JP | H0981469 | A | | 3/1997 |
| JP | H09244772 | A | | 9/1997 |
| JP | 200040039 | A | | 2/2000 |
| JP | 2000040039 | * | 2/2000 | ............ G06F 13/00 |
| JP | 2008309741 | * | 12/2008 | ............ G01B 31/28 |
| JP | 201050872 | A | | 3/2010 |
| KR | 1020100101992 | A | | 9/2010 |

* cited by examiner

500 — Provide a chip, where the chip includes an input terminal for receiving an input signal, a core circuit, an output terminal for outputting an output signal, a first transmission line, a second transmission line and a spare transmission line, where the first transmission line is coupled between the input terminal and the core circuit, the second transmission line is coupled between the output terminal and the core circuit, and the spare transmission line is coupled between the input terminal and the output terminal 502 — When the core circuit fails to process the input signal normally, the input signal is directly transmitted to the output terminal via the spare transmission line, and the input signal serves as the output signal to be outputted from the output terminal

FIG. 5

CHIP APPLIED TO SERIAL TRANSMISSION SYSTEM AND ASSOCIATED FAIL SAFE METHOD

BACKGROUND OF THE INVENTION

1. Field of the Invention

The present invention relates to chip design, and more particularly, to a chip applied to a serial transmission system and associated fail safe method.

2. Description of the Prior Art

In a typical serial transmission system including a plurality of chips, an input signal sequentially goes through the first chip, the second chip, . . . , to the last chip. However, if one of the chips is failed, the input signal cannot be sent to a next chip from the failed chip, therefore, all the chips next to the failed chip cannot receive and process the input signal. Therefore, how to make the chips next to the failed chip be operated normally is an important topic.

SUMMARY OF THE INVENTION

It is therefore an objective to provide a chip applied to a serial transmission system and associated fail safe method, to solve the above-mentioned problem.

According to one embodiment of the present invention, a chip applied to a serial transmission system comprises an input terminal for receiving an input signal from a source outside the chip, a core circuit, an output terminal for outputting an output signal, a first transmission line, coupled between the input terminal and the core circuit, a second transmission line coupled between the core circuit and the output terminal, a spare transmission line coupled between the input terminal and the output terminal, where the first transmission line is for selectively transmitting the input signal to the core circuit, the second transmission line is for selectively transmitting an output of the core circuit to the output terminal; and when the core circuit fails to be operated normally, the input signal is directly transmitted to the output terminal via the spare transmission line, and the input signal serves as the output signal to be outputted from the output terminal.

According to another embodiment of the present invention, a fail safe method of a chip applied to a serial transmission system is provided, where the chip comprises an input terminal for receiving an input signal from a source outside the chip, a core circuit, an output terminal for outputting an output signal, a first transmission line, a second transmission line and a spare transmission line, where the first transmission line is coupled between the input terminal and the core circuit, and is utilized for selectively transmitting the input signal to the core circuit; the second transmission line is coupled between the core circuit and the output terminal, and is utilized for selectively transmitting an output of the core circuit to the output terminal; and the spare transmission line is coupled between the input terminal and the output terminal; and the fail safe method comprises: when the core circuit fails to be operated normally, directly transmitting the input signal to the output terminal via the spare transmission line, and the input signal serves as the output signal to be outputted from the output terminal.

According to another embodiment of the present invention, a chip applied to a serial transmission system comprises a first input terminal for receiving a first input signal from a source outside the chip, a second input terminal for receiving a second input signal from the source outside the chip, a core circuit for processing the first input signal or the second input signal to generate an output signal, a switch module coupled between the first input terminal, the second input terminal and the core circuit, a first output terminal, a second output terminal, and a spare transmission line coupled between the first input terminal and the second output terminal, where the first input signal is different from the second input signal, and the switch module is for selectively transmitting the first input signal or the second input signal to the core circuit; where the core circuit transmits the output signal to the first output terminal, and the output signal is outputted from the first output terminal; and the first input signal is directly transmitted to the second output terminal via the spare transmission line, and the first input signal is outputted from the second output terminal.

According to another embodiment of the present invention, a fail safe method of a chip applied to a serial transmission system is provided, where the chip comprises a first input terminal for receiving a first input signal from a source outside the chip, a second input terminal for receiving a second input signal from the source outside the chip, a core circuit for processing the first input signal or the second input signal to generate an output signal, a first output terminal, a second output terminal, and a spare transmission line coupled between the first input terminal and the second output terminal, where the first input signal is different from the second input signal, and the fail safe method comprises: selectively transmitting the first input signal or the second input signal to the core circuit; transmitting the output signal to the first output terminal, and the output signal is outputted from the first output terminal; and directly transmitting the first input signal to the second output terminal via the spare transmission line, and the first input signal is outputted from the second output terminal.

According to another embodiment of the present invention, a chip applied to a serial transmission system comprises a plurality of registers and a fault detection unit, where the fault detection unit is for determining whether a preceding chip positioned before the chip in the serial transmission system is failed or not. When the fault detection unit determines that the preceding chip is not failed, the chip merely utilizes M registers of the plurality of registers to receive an input signal from the preceding chip; and when the fault detection unit determines that the preceding chip is failed, the chip utilizes N registers of the plurality of registers to receive the input signal, where N and M are positive integers, and N is greater than M.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a flow chart of a fail safe method of a chip applied to a serial transmission system according to one embodiment of the present invention.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
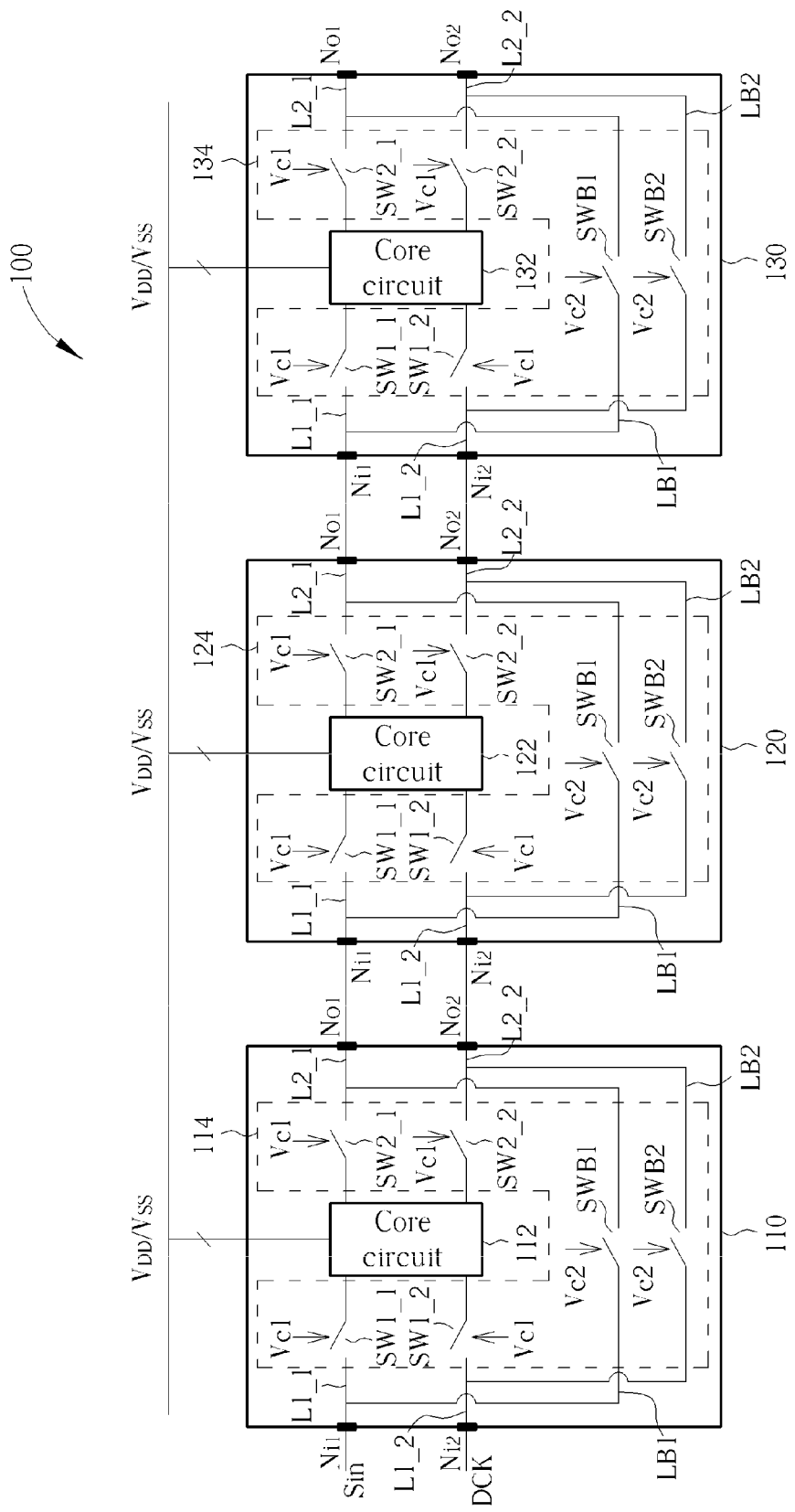
FIG. 1 is a diagram illustrating a serial transmission system according to one embodiment of the present invention.

Please refer to FIG. 1, which is a diagram illustrating a serial transmission system 100 according to one embodiment of the present invention. As shown in FIG. 1, the serial transmission system 100 includes a plurality of chips (in this embodiment, there are three chips 110, 120 and 130), where the chip 110 includes input terminals $N_{i1}$ and $N_{i2}$, output terminals $N_{O1}$ and $N_{O2}$, a core circuit 112, a switch module 114, first transmission lines L1_1 and L1_2, second transmission lines L2_1 and L2_2, and spare transmission lines LB1 and LB2, where the first transmission lines L1_1 and L1_2 are coupled between the input terminals $N_{i1}$ and $N_{i2}$ and the core circuit 112, respectively, and the first transmission lines L1_1 and L1_2 are used to transmit input signals (including data signal Sin and clock signal DCK) to the core circuit 112; the second transmission lines L2_1 and L2_2 are coupled between the output terminals $N_{O1}$ and $N_{O2}$ and the core circuit 112, respectively, and the second transmission lines L2_1 and L2_2 are used to transmit outputs of the core circuit 112 to the output terminals $N_{O1}$ and $N_{O2}$, respectively; the spare transmission lines LB1 and LB2 is coupled to the input terminals $N_{i1}$ and $N_{i2}$ and the output terminals $N_{O1}$ and $N_{O2}$, respectively, and the spare transmission lines LB1 and LB2 are used to directly transmit the input signals from the input terminals $N_{i1}$ and $N_{i2}$ to the output terminals $N_{O1}$ and $N_{O2}$, respectively. In addition, the switch module 114 includes a switch SW1_1 positioned on the first transmission line L1_1, a switch SW1_2 positioned on the first transmission line L1_2, a switch SW2_1 positioned on the second transmission line L2_1, a switch SW2_2 positioned on the second transmission line L2_2, a switch SWB1 positioned on the spare transmission line LB1, and a switch SWB2 positioned on the spare transmission line LB2. In addition, the chip 120 includes input terminals $N_{i1}$ and $N_{i2}$, output terminals $N_{O1}$ and $N_{O2}$, a core circuit 122, a switch module 124, first transmission lines L1_1 and L1_2, second transmission lines L2_1 and L2_2, and spare transmission lines LB1 and LB2; and the chip 130 includes input terminals $N_{i1}$ and $N_{i2}$, output terminals $N_{O1}$ and $N_{O2}$, a core circuit 132, a switch module 134, first transmission lines L1_1 and L1_2, second transmission lines L2_1 and L2_2, and spare transmission lines LB1 and LB2. In addition, in this embodiment, the chips 110, 120 and 130 are the same.

Figure 2:
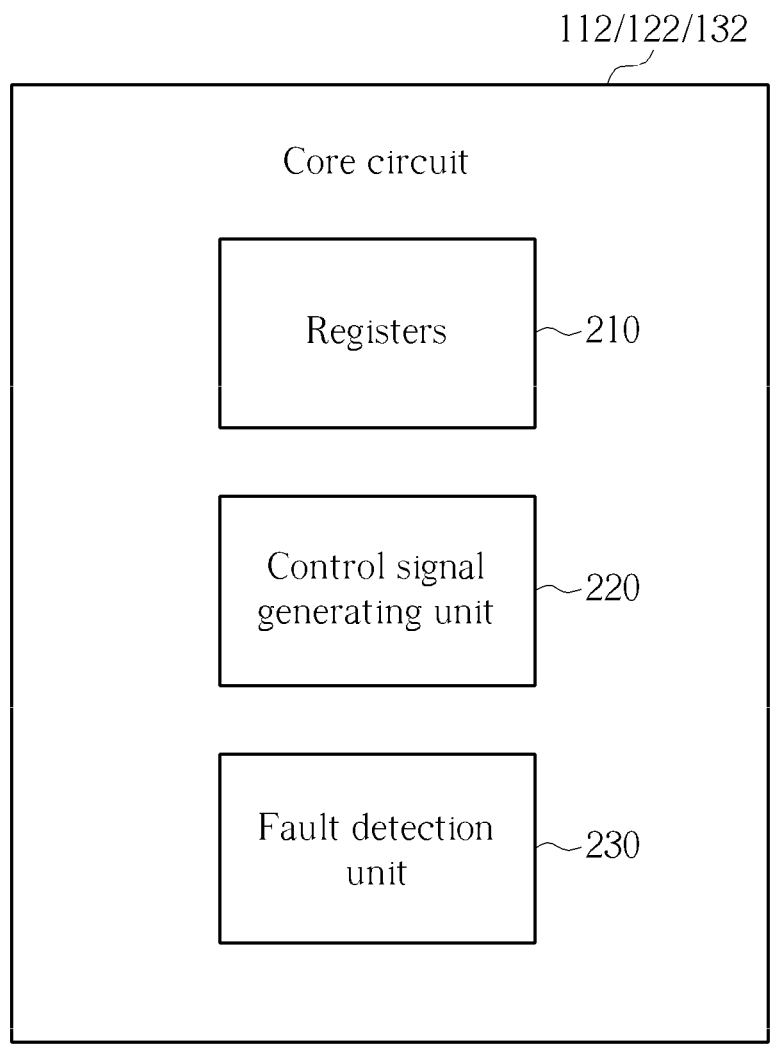
FIG. 2 is a diagram illustrating a core circuit shown in FIG. 1.

Please refer to FIG. 2, which is a diagram illustrating the core circuits 112, 122 and 132 shown in FIG. 1. As shown in FIG. 2, taking the core circuit 122 as an example, the core circuit 122 comprises at least a plurality of registers 210, a control signal generating unit 220 and a fault detection unit 230, where the registers 210 are used to receive the input signal from a source outside the chip 120, and to store the data carried on the input signal. The control signal generating unit 220 is used to generate control signals Vc1 and Vc2 to control the switch module 124. The fault detection unit 230 is used to detect whether the preceding chip (i.e., chip 110) is failed. In addition, in another embodiment of the present invention, the fault detection unit 230 can be positioned outside the core circuits 112, 122 and 132.

In addition, in this embodiment, the switches SWB1 and SWB2 of the switch modules 114, 124 and 134 can be implemented by depletion metal-oxide-semiconductor field-effect transistors (DMOSFETs), but it is not meant to be a limitation of the present invention.

In the operations of the serial transmission system 100, when all the chips 110, 120 and 130 can process the input signals (the input signals include the data signal Sin and the clock signal DCK) normally, the data signal Sin and the clock signal DCK are transmitted to the chip 130 via the chips 110 and 120. Taking the chip 120 as an example, the control signal generating unit 220 generates the control signal Vc1 to switch on the switches SW1_1, SW1_2, SW2_1 and SW2_2, to make the input signals be transmitted to the core circuit 122 via the first transmission lines L1_1 and L1_2, then the input signals are transmitted from the core circuit 122 to the output terminals $N_{O1}$ and $N_{O2}$ via the second transmission lines L2_1 and L2_2. In addition, the control signal generating unit 220 generates the control signal Vc2 to switch off the switches SWB1 and SWB2, to make the input signals not be transmitted to the output terminals $N_{O1}$ and $N_{O2}$ via the spare transmission lines LB1 and LB2. In other words, when all the chips 110, 120 and 130 can process the input signals normally, the input signals are transmitted to the output terminals $N_{O1}$ and $N_{O2}$ via the first transmission lines L1_1 and L1_2, the core circuit 122 and the second transmission lines L2_1 and L2_2, and no signal will be passed through the spare transmission lines LB1 and LB2.

Furthermore, when something is failed in the chip 120, such as the core circuit 122 is burned out, short circuit fault, or supply voltages $V_{DD}$ and $V_{SS}$ cannot be supplied to the core circuit 122, and the core circuit 122 of the chip 120 cannot process the received signal normally, the control signal generating unit 220 cannot generate the control signals Vc1 and Vc2 to control the switches of the switch module 124. Therefore, the first transmission lines L1_1 and L1_2 and the second transmission lines L2_1 and L2_2 are open (i.e., the signals cannot pass through), and the switches SWB1 and SWB2 respectively positioned on the spare transmission lines LB1 and LB2 are switched on because the switches SWB1 and SWB2 are implemented by DMOSFETs. Therefore, the input signals of the chip 120 can be directly transmitted to the output terminals $N_{O1}$ and $N_{O2}$ via the spare transmission lines LB1 and LB2, that is, the chip 130 can receive the input signals even when the chip 120 is failed.

It is noted that, the quantity, species and design of the switches of the above-mentioned switch module 124 (or the switch modules 114 and 134) are for illustrative purposes only, and are not to be limitations of the present invention. As long as when the chip 120 is normally operated, the switch module 124 can make the first transmission lines L1_1 and L1_2 and the second transmission lines L2_1 and L2_2 be conducted, and make spare transmission lines LB1 and LB2 not be conducted; and when the chip 120 is failed, the switch module 124 can make the first transmission lines L1_1 and L1_2 and the second transmission lines L2_1 and L2_2 not be conducted, and make the spare transmission lines LB1 and LB2 be conducted, the switch module 124 can have other designs. These alternative designs shall fall within the scope of the present invention.

In addition, because the input signals are directly transmitted to the output terminals $N_{O1}$ and $N_{O2}$ via the spare transmission lines LB1 and LB2 when the chip 120 is failed, no data is stored in the core circuit 122 of the chip 120, a data transmission problem may occur in the serial transmission system 100. For example, assuming that the serial transmission system 100 includes only three chips 110, 120 and 130, the data signal Sin is 24 bits, registers of the core circuit of each of the chips 110, 120 and 130 requires to store 8 bits data, if one of the chips is failed, its next chip may not receive the correct data. To solve this problem, the registers 210 of the chips 110, 120 and 130 can store a plurality of bits, and when the fault detection unit 230 detects that the preceding chip is not failed, the chip uses M registers of the registers 210 to store the received data; and when the fault detection unit 230 detects that the preceding chip is failed, the chip uses N registers of the registers 210 to store the received data, where N is greater than M. For example, assuming that the serial transmission system 100 includes only three chips 110, 120 and 130 and the data signal Sin is 24 bits, the chips 110, 120 and 130 can be designed to include 16 registers. If the chip 120 can be operated normally, the chip 130 merely uses 8 registers to store the received data; and if the chip 120 is failed and the fault detection unit 230 of the chip 130 detects that the chip 120 is failed, the chip 130 uses 16 registers to store the received data. That is, when the chip 120 is failed, the chip 130 will store all the data which is originally designed to be stored in the chips 120 and 130.

In one embodiment of the present invention, the serial transmission system 100 is applied to a light-emitting diode (LED) driving circuit, that is the chips 110, 120 and 130 are connected to LED strings, respectively, and the data signal Sin includes driving data of the LED strings.

Figure 3:
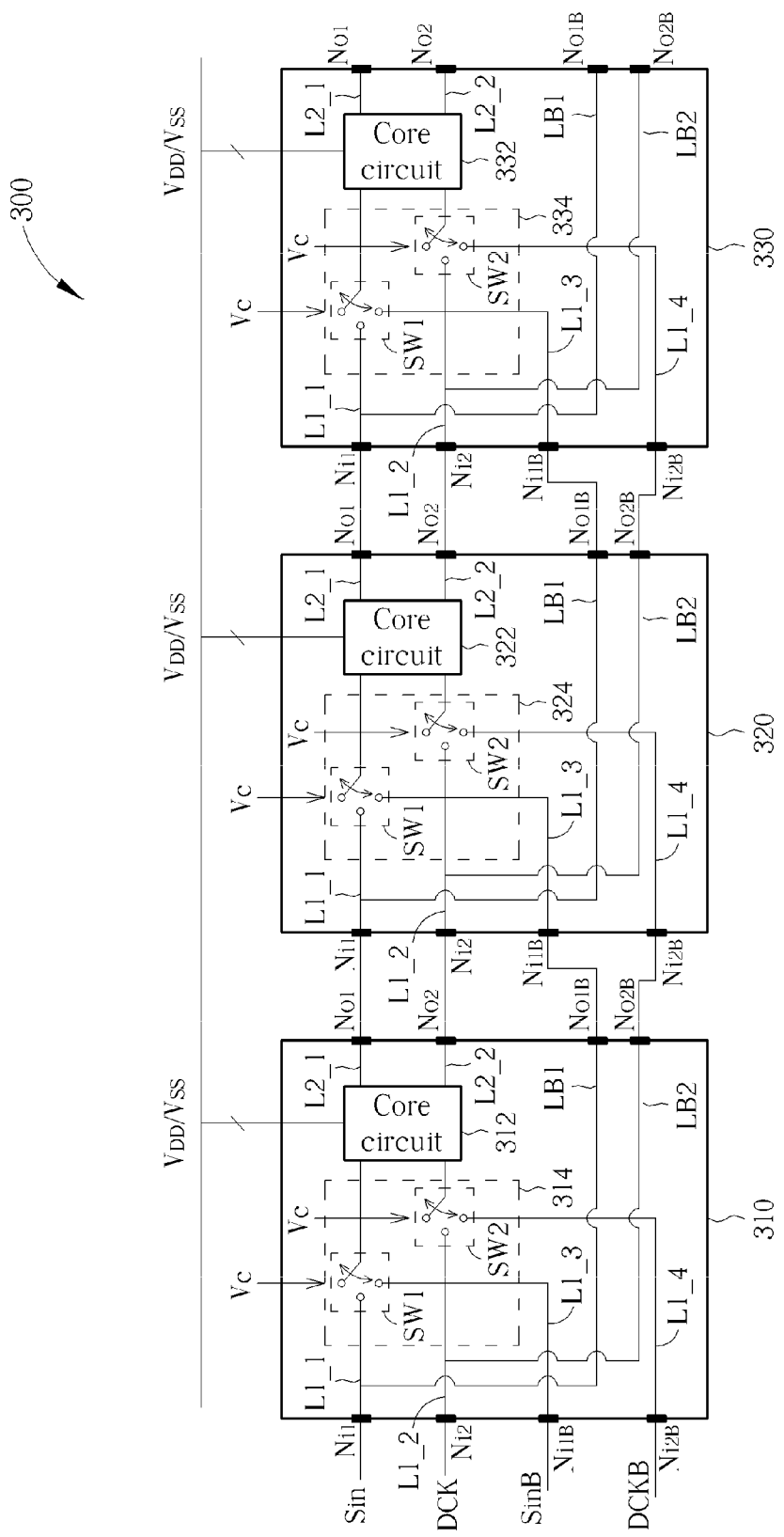
FIG. 3 is a diagram illustrating a serial transmission system according to another embodiment of the present invention.

Please refer to FIG. 3, which is another diagram illustrating a serial transmission system 300 according to another embodiment of the present invention. As shown in FIG. 3, the serial transmission system 300 includes a plurality of chips (in this embodiment, there are three chips 310, 320 and 330), where the chip 310 includes input terminals $N_{i1}, N_{i2}, N_{i1B}$ and $N_{i2B}$, output terminals $N_{O1}, N_{O2}, N_{O1B}$ and $N_{O2B}$, a core circuit 312, a switch module 314, first transmission lines L1_1, L1_2, L1_3 and L1_4, second transmission lines L2_1 and L2_2, and spare transmission lines LB1 and LB2, where the first transmission lines L1_1, L1_2, L1_3 and L1_4 are coupled between the input terminals $N_{i1}, N_{i2}, N_{i1B}$ and $N_{i2B}$ and the core circuit 312, respectively, and the first transmission lines L1_1, L1_2, L1_3 and L1_4 are used to transmit input signals (including data signal Sin, clock signal DCK, spare data signal SinB, spare clock signal DCKB) to the core circuit 312; the second transmission lines L2_1 and L2_2 are coupled between the output terminals $N_{O1}$ and $N_{O2}$ and the core circuit 312, respectively, and the second transmission lines L2_1 and L2_2 are used to transmit outputs of the core circuit 312 to the output terminals $N_{O1}$ and $N_{O2}$, respectively; the spare transmission lines LB1 and LB2 is coupled to the input terminals $N_{i1}$ and $N_{i2}$ and the output terminals $N_{O1B}$ and $N_{O2B}$, respectively, and the spare transmission lines LB1 and LB2 are used to directly transmit the input signals from the input terminals $N_{i1}$ and $N_{i2}$ to the output terminals $N_{O1B}$ and $N_{O2B}$, respectively. In addition, the switch module 314 includes switches SW1 and SW2, where the switch SW1 is coupled between the input terminals $N_{i1}, N_{i1B}$ and the core circuit 312, and the switch SW1 is used to selectively transmit the data signal Sin or the spare data signal SinB to the core circuit 312; and the switch SW2 is coupled between the input terminals $N_{i2}, N_{i2B}$ and the core circuit 312, and the switch SW2 is used to selectively transmit the clock signal DCK or the spare clock signal DCKB to the core circuit 312. In addition, the chip 320 includes input terminals $N_{i1}, N_{i2}, N_{i1B}$ and $N_{i2B}$, output terminals $N_{O1}, N_{O2}, N_{O1B}$ and $N_{O2B}$, a core circuit 322, a switch module 324, first transmission lines L1_1, L1_2, L1_3 and L1_4, second transmission lines L2_1 and L2_2, and spare transmission lines LB1 and LB2; and the chip 330 includes input terminals $N_{i1}, N_{i2}, N_{i1B}$ and $N_{i2B}$, output terminals $N_{O1}, N_{O2}, N_{O1B}$ and $N_{O2B}$, a core circuit 332, a switch module 334, first transmission lines L1_1, L1_2, L1_3 and L1_4, second transmission lines L2_1 and L2_2, and spare transmission lines LB1 and LB2. In addition, in this embodiment, the chips 310, 320 and 330 are the same.

Figure 4:
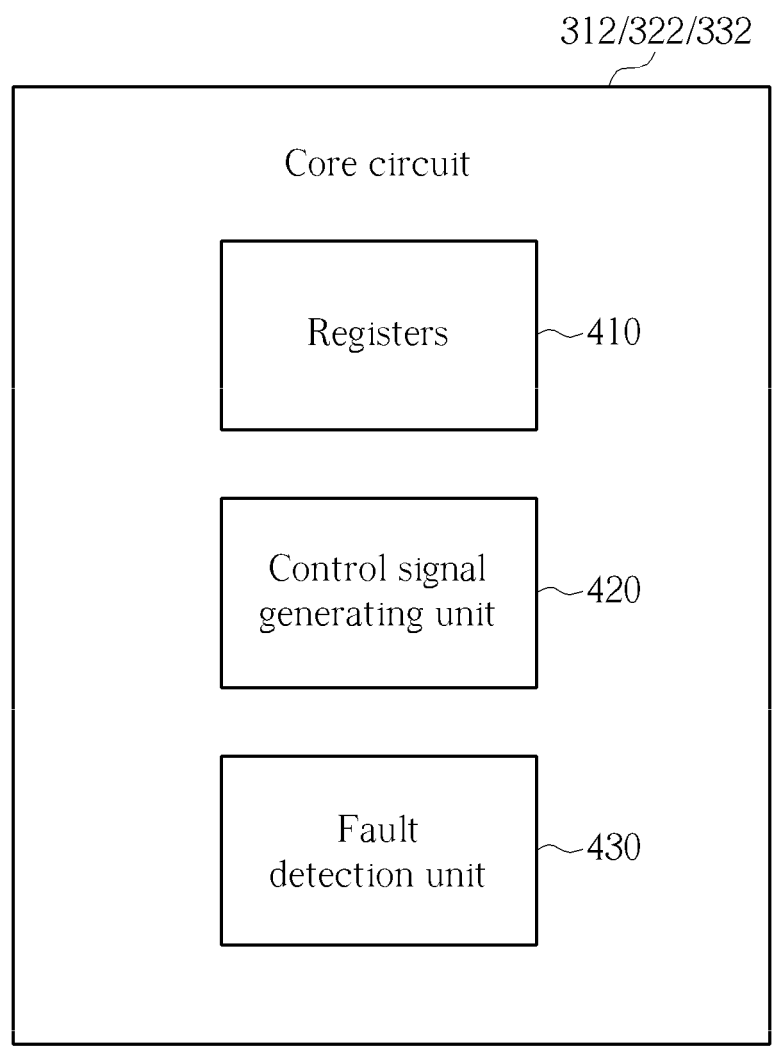
FIG. 4 is a diagram illustrating a core circuit shown in FIG. 3.

Please refer to FIG. 4, which is a diagram illustrating the core circuits 312, 322 and 332 shown in FIG. 3. As shown in FIG. 4, taking the core circuit 322 as an example, the core circuit 322 comprises at least a plurality of registers 410, a control signal generating unit 420 and a fault detection unit 430, where the registers 410 are used to receive the input signal from a source outside the chip 320, and to store the data carried on the input signal. The control signal generating unit 420 is used to generate control signal Vc to control the switches SW1 and SW2 of the switch module 324. The fault detection unit 430 is used to detect whether the preceding chip (i.e., chip 310) is failed. In addition, in another embodiment of the present invention, the fault detection unit 430 can be positioned outside the core circuits 312, 322 and 332.

In the operations of the serial transmission system 300, taking the chip 330 as an example, the fault detection unit 430 of the chip 330 detects whether the preceding chip 320 is failed. If the chip 320 is not failed, the control signal generating unit 420 generates the control signal Vc to control the switches SW1 and SW2 to conduct the first transmission lines L1_1 and L1_2, and the core circuit 332 can receive the data signal Sin and the clock signal DCK, then the data signal Sin and the clock signal DCK are transmitted to the output terminals $N_{O1}$ and $N_{O2}$ via the second transmission lines L2_1 and L2_2. At this time, the core circuit 332 does not receive the spare data signal SinB and the spare clock signal DCKB from the output terminals $N_{i1B}$ and $N_{i2B}$, respectively.

Furthermore, when something is failed in the chip 320, such as the core circuit 322 is burned out, short circuit fault, or supply voltages $V_{DD}$ and $V_{SS}$ cannot be supplied to the core circuit 322, and the core circuit 322 of the chip 320 cannot process the received signal normally, the control signal generating unit 420 of the chip 330 generates the control signal Vc to control the switches SW1 and SW2 to conduct the first transmission lines L1_3 and L1_4. and the core circuit 332 can receive the spare data signal SinB and the spare clock signal DCKB, then the spare data signal SinB and the spare clock signal DCKB are transmitted to the output terminals $N_{O1}$ and $N_{O2}$ via the second transmission lines L2_1 and L2_2. At this time, the core circuit 332 does not receive the data signal Sin and the clock signal DCK from the output terminals $N_{i1}$ and $N_{i2}$, respectively. In other words, when the chip 320 is failed, the input signals of the chip 330 are the same as the input signals of the chip 320, therefore, the chip 330 can receive the input signals even when the chip 320 is failed.

It is noted that, the quantity, species and design of the switches of the above-mentioned switch modules 314, 324 and 334 are for illustrative purposes only, and are not to be limitations of the present invention. As long as when the preceding chip is normally operated, the switch module 314/324/334 can conduct the first transmission lines L1_1 and L1_2 (the core circuit receives the data signal Sin and the clock signal DCK), and not conduct the first transmission lines L1_3 and L1_4 (the core circuit does not receive the spare data signal SinB and the spare clock signal DCKB); and when the preceding chip is failed, the switch module 314/324/334 does not conduct the first transmission lines L1_1 and L1_2 (the core circuit does not receive the data signal Sin and the clock signal DCK), but the first transmission lines L1_3 and L1_4 are conducted (the core circuit receives the spare data signal SinB and the spare clock signal DCKB), the switch module 314/324/334 can have other designs. These alternative designs shall fall within the scope of the present invention.

In addition, because the input signals are directly transmitted to the chip 330 via the output terminals $N_{O1B}$ and $N_{O2B}$ and the spare transmission lines LB1 and LB2 when the chip 320 is failed, no data is stored in the core circuit 322 of the chip 320, a data transmission problem may occur in the serial transmission system 300. For example, assuming that the serial transmission system 300 includes only three chips 310, 320 and 330, the data signal Sin is 24 bits, registers of the core circuit of each of the chips 310, 320 and 330 requires to store 8 bits data, if one of the chips is failed, its next chip may not receive the correct data. To solve this problem, the registers 410 of the chips 310, 320 and 330 can store a plurality of bits, and when the fault detection unit 430 detects that the preceding chip is not failed, the chip uses M registers of the registers 410 to store the received data; and when the fault detection unit 430 detects that the preceding chip is failed, the chip uses N registers of the registers 410 to store the received data, where N is greater than M. For example, assuming that the serial transmission system 300 includes only three chips 310, 320 and 330 and the data signal Sin is 24 bits, the chips 310, 320 and 330 can be designed to include 16 registers. If the chip 320 can be operated normally, the chip 330 merely uses 8 registers to store the received data; and if the chip 320 is failed and the fault detection unit 430 of the chip 330 detects that the chip 320 is failed, the chip 330 uses 16 registers to store the received data. That is, when the chip 320 is failed, the chip 330 will store all the data which is originally designed to be stored in the chips 320 and 330.

In one embodiment of the present invention, the serial transmission system 300 is applied to a light-emitting diode (LED) driving circuit, that is the chips 310, 320 and 330 are connected to LED strings, respectively, and the data signal Sin includes driving data of the LED strings.

Please refer to FIG. 5, which is a flow chart of a fail safe method of a chip applied to a serial transmission system according to one embodiment of the present invention. Referring to FIG. 1 and FIG. 5, the flow is described as follows:

Step 500: provide a chip, where the chip includes an input terminal for receiving an input signal, a core circuit, an output terminal for outputting an output signal, a first transmission line, a second transmission line and a spare transmission line, where the first transmission line is coupled between the input terminal and the core circuit, the second transmission line is coupled between the output terminal and the core circuit, and the spare transmission line is coupled between the input terminal and the output terminal.

Step 502: when the core circuit fails to process the input signal normally, the input signal is directly transmitted to the output terminal via the spare transmission line, and the input signal serves as the output signal to be outputted from the output terminal.

Figure 6:
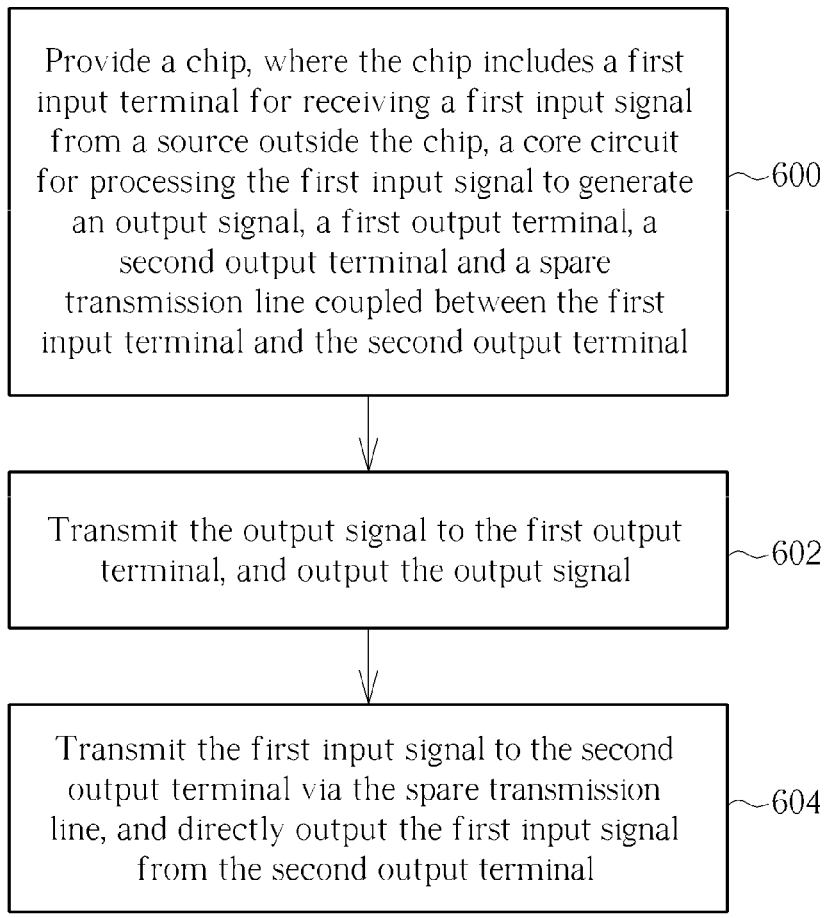
FIG. 6 is a flow chart of a fail safe method of a chip applied to a serial transmission system according to another embodiment of the present invention.

Please refer to FIG. 6, which is a flow chart of a fail safe method of a chip applied to a serial transmission system according to another embodiment of the present invention. Referring to FIG. 1 and FIG. 6, the flow is described as follows:

Step 600: provide a chip, where the chip includes a first input terminal for receiving a first input signal from a source outside the chip, a core circuit for processing the first input signal to generate an output signal, a first output terminal, a second output terminal and a spare transmission line coupled between the first input terminal and the second output terminal.

Step 602: transmit the output signal to the first output terminal, and output the output signal.

Step 604: transmit the first input signal to the second output terminal via the spare transmission line, and directly output the first input signal from the second output terminal.

Briefly summarized, in the chip applied to a serial transmission system and associated fail safe method of the present invention, spare transmission lines are designed to make sure that the chips next to a failed chip can be operated normally. In addition, a size of the registers of the chip can be adjusted by referring a status of the preceding chip (fail or not), to prevent from data transmission problem in the serial transmission system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip applied to a serial transmission system, comprising:
   an input terminal, for receiving an input signal from a source outside the chip;
   a core circuit;
   an output terminal, for outputting an output signal;
   a first transmission line, coupled between the input terminal and the core circuit, for selectively transmitting the input signal to the core circuit;
   a second transmission line, coupled between the core circuit and the output terminal, for selectively transmitting an output of the core circuit to the output terminal;
   a spare transmission line, coupled between the input terminal and the output terminal; and
   a switch module, positioned on the spare transmission line, for selectively conducting the spare transmission line;
   wherein when the core circuit fails to be operated normally, the input signal is directly transmitted to the output terminal via the spare transmission line, and the input signal serves as the output signal to be outputted from the output terminal; and when the core circuit is operated normally, the core circuit generates at least one control signal to control the switch module not conduct the spare transmission line; and when the core circuit fails to be operated normally, the core circuit does not generate the at least one control signal to the switch module, and the switch module conducts the spare transmission line.

2. The chip of claim 1, wherein when the core circuit is operated normally, the core circuit transmits its output to the output terminal via the second transmission line, and the output of the core circuit serves as the output signal to be outputted from the output terminal; and the input signal is not transmitted to the output terminal via the spare transmission line.

3. The chip of claim 1, wherein the switch module is also positioned on the first transmission line and the second transmission line, and is utilized for selectively conducting the first transmission line and the second transmission line.

4. The chip of claim 3, wherein when the core circuit is operated normally, the core circuit generates the at least one control signal to control the switch module to conduct the first transmission line, to conduct the second transmission line, and to not conduct the spare transmission line; and when the core circuit fails to be operated normally, the core circuit does not generate the at least one control signal to the switch module, and the switch module conducts the spare transmission line, and does not conduct the first transmission line and the second transmission line.

5. The chip of claim 1, further comprising:
a plurality of registers, positioned inside or outside the core circuit; and
a fault detection unit, positioned inside or outside the core circuit, for determining whether a preceding chip positioned before the chip in the serial transmission system is failed or not;
wherein when the fault detection unit determines that the preceding chip is not failed, the chip merely utilizes M registers of the plurality of registers to receive the input signal; and when the fault detection unit determines that the preceding chip is failed, the chip utilizes N registers of the plurality of registers to receive the input signal, where N and M are positive integers, and N is greater than M.

6. A fail safe method of a chip applied to a serial transmission system, wherein the chip comprises an input terminal for receiving an input signal from a source outside the chip, a core circuit, an output terminal for outputting an output signal, a first transmission line, a second transmission line and a spare transmission line, where the first transmission line is coupled between the input terminal and the core circuit, and is utilized for selectively transmitting the input signal to the core circuit; the second transmission line is coupled between the core circuit and the output terminal, and is utilized for selectively transmitting an output of the core circuit to the output terminal; and the spare transmission line is coupled between the input terminal and the output terminal; and the fail safe method comprises:
when the core circuit fails to be operated normally, directly transmitting the input signal to the output terminal via the spare transmission line, and the input signal serves as the output signal to be outputted from the output terminal;
wherein the chip comprises a plurality of registers positioned inside or outside the core circuit, and the fail safe method comprises:
determining whether a preceding chip positioned before the chip in the serial transmission system is failed or not;
when it is determined that the preceding chip is not failed, the chip merely utilized M registers of the plurality of registers to receive the input signal; and
when it is determined that the preceding chip is failed, the chip utilized N registers of the plurality of registers to receive the input signal, where N and M are positive integers, and N is greater that M.

7. The fail safe method of claim 6, further comprising:
when the core circuit is operated normally:
transmitting the output of the core circuit to the output terminal via the second transmission line, and the output of the core circuit serves as the output signal to be outputted from the output terminal; and
not transmitting the input signal to the output terminal via the spare transmission line.

8. The fail safe method of claim 6, further comprising:
selectively conducting the spare transmission line.

9. The fail safe method of claim 8, further comprising:
when the core circuit is operated normally, generating at least one control signal to control not conducting the spare transmission line; and
when the core circuit fails to be operated normally, not generating the at least one control signal to conduct the spare transmission line.

10. The fail safe method of claim 8, further comprising:
selectively conducting the first transmission line and the second transmission line.

11. The fail safe method of claim 10, further comprising:
when the core circuit is operated normally, generating at least one control signal to control conducting the first transmission line, conducting the second transmission line, and not conducting the spare transmission line; and
when the core circuit fails to be operated normally, not generating the at least one control signal to conduct the spare transmission line, and not conduct the first transmission line and the second transmission line.

12. A chip applied to a serial transmission system, comprising:
a first input terminal, for receiving a first input signal from a source outside the chip;
a second input terminal, for receiving a second input signal from the source outside the chip, wherein the second input signal is different from the first input signal;
a core circuit, for processing the first input signal or the second input signal to generate an output signal;
a switch module, coupled between the first input terminal, the second input terminal and the core circuit, for selectively transmitting the first input signal or the second input signal to the core circuit;
a first output terminal;
a second output terminal;
a spare transmission line, coupled between the first input terminal and the second output terminal; and
a fault detection unit, positioned inside or outside the core circuit, for determining whether a preceding chip positioned before the chip in the serial transmission system is failed or not;
wherein the core circuit transmits the output signal to the first output terminal, and the output signal is outputted from the first output terminal; and the first input signal is directly transmitted to the second output terminal via the spare transmission line, and the first input signal is outputted from the second output terminal;
wherein when the fault detection unit determines that the preceding chip is not failed, the switch module is controlled to make the first input signal be transmitted to the core circuit, and to make the second input signal not be transmitted to the core circuit; and when the fault detection unit determines that the preceding chip is failed, the switch module is controlled to make the second input signal be transmitted to the core circuit, and to make the first input signal not be transmitted to the core circuit.

13. The chip of claim 12, further comprising:
a plurality of registers, positioned inside or outside the core circuit; and
a fault detection unit, positioned inside or outside the core circuit, for determining whether a preceding chip positioned before the chip in the serial transmission system is failed or not;
wherein when the fault detection unit determines that the preceding chip is not failed, the chip merely utilizes M registers of the plurality of registers to receive the input signal; and when the fault detection unit determines that the preceding chip is failed, the chip utilizes N registers of the plurality of registers to receive the input signal, where N and M are positive integers, and N is greater than M.

14. A fail safe method of a chip applied to a serial transmission system, wherein the chip comprises a first input terminal for receiving a first input signal from a source outside the chip, a second input terminal for receiving a second input signal from the source outside the chip, a core circuit for processing the first input signal or the second input signal to generate an output signal, a first output terminal, a second output terminal, and a spare transmission line coupled between the first input terminal and the second output terminal, where the first input signal is different from the second input signal, and the fail safe method comprises:
   selectively transmitting the first input signal or the second input signal to the core circuit;
   transmitting the output signal to the first output terminal, and the output signal is outputted from the first output terminal;
   directly transmitting the first input signal to the second output terminal via the spare transmission line, and the first input signal is outputted from the second output terminal;
   determining whether a preceding chip positioned before the chip in the serial transmission system is failed or not;
   when it is determined that the preceding chip is not failed, controlling the first input signal to be transmitted to the core circuit, and controlling the second input signal to not be transmitted to the core circuit; and
   when it is determined that the preceding chip is failed, controlling the second input signal to be transmitted to the core circuit, and controlling the first input signal to not be transmitted to the core circuit.

15. The fail safe method of claim 14, wherein the chip further comprises a plurality of registers positioned inside or outside the core circuit, and the fail safe method further comprises:
   determining whether a preceding chip positioned before the chip in the serial transmission system is failed or not;
   when it is determined that the preceding chip is not failed, the chip merely utilizes M registers of the plurality of registers to receive the input signal; and
   when it is determined that the preceding chip is failed, the chip utilizes N registers of the plurality of registers to receive the input signal, where N and M are positive integers, and N is greater than M.

16. A chip applied to a serial transmission system, comprising:
   a plurality of registers; and
   a fault detection unit, for determining whether a preceding chip positioned before the chip in the serial transmission system is failed or not;
   wherein when the fault detection unit determines that the preceding chip is not failed, the chip merely utilizes M registers of the plurality of registers to receive an input signal from the preceding chip; and when the fault detection unit determines that the preceding chip is failed, the chip utilizes N registers of the plurality of registers to receive the input signal, where N and M are positive integers, and N is greater than M.

17. The chip of claim 16, wherein N is a multiple of M.

* * * * *